United States Patent [19]

Petiot

[11] 3,955,875

[45] May 11, 1976

[54] CONNECTOR

[75] Inventor: Gerard Petiot, Champigny-sur-Marne, France

[73] Assignee: Compagnie Honeywell Bull (Societe Anonyme), Paris, France

[22] Filed: Nov. 19, 1974

[21] Appl. No.: 525,283

[30] Foreign Application Priority Data

Nov. 22, 1973 France .............................. 73.41641

[52] U.S. Cl. .......................................... 339/176 MP

[51] Int. Cl.² .......................................... H05K 1/07

[58] Field of Search ......... 339/17 LM, 17 LC, 17 F, 339/176 MF, 176 MP

[56] References Cited

UNITED STATES PATENTS 3,609,463 9/1971 Laboue .......................... 339/17 LM 3,614,707 10/1971 Kaufmann et al............ 339/176 MF

*Primary Examiner*—Roy Lake

*Assistant Examiner*—Neil Abrams

*Attorney, Agent, or Firm*—Cameron, Kerkam, Sutton, Stowell & Stowell

[57] ABSTRACT

An improved connector is disclosed which is adapted to connect circuits on a printed circuit board to circuits on a printed circuit connection panel. A plurality of connectors are mounted on the printed circuit connection panel and are arranged so that their central longitudinal axes are parallel to and at a distance from one another so as to allow a printed circuit card to be inserted between two adjacent connectors and to be held in position therebetween. A novel set of spring strips directly bias the contact blades of the connector into contact with the circuits on the printed circuit cards.

8 Claims, 7 Drawing Figures

CONNECTOR

BACKGROUND AND SUMMARY OF THE INVENTION

The present invention relates to connectors for printed-circuit cards, and more particularly, to an improved connector which is intended to electrically connect the conductors on printed-circuit cards or boards to conductors on a printed-circuit type connection panel.

Obviously, such connectors need to reduce, to a minimum, the length of the conductors which are utilized with the circuits. If the length of the conductors are too long, the conductors will introduce, into the circuit, electrical characteristics which are likely to cause a substantial alteration in the electrical characteristics of the circuits which they interconnect, and which may possibly introduce inductive coupling or undesirable capacitance between the circuits.

Techniques used at the present time to produce compact circuits make it possible to reduce considerably the size of the majority of the electrical circuits contained in data-processing or other equipment. Such compact circuits are often produced in the form of printed circuits. Multiple layers of these printed circuits are sometimes combined into removable cards and into connection panels which are designed to hold connectors and to provide electrical connection between the circuits on different cards. To provide the electrical connections between the circuits on the cards and the circuits in the connection panels, it is essential to use connectors. Such connectors group together a very large number of contact members in a very small space.

Numerous connectors are known in which the contact members, which provide the electrical connections, are formed by flexible, conductive blades or pins that are relatively long and are often folded back on themselves. These contact members are adapted to provide adequate pressure against the contact surfaces by their own elasticity. When such connectors electrically connect together circuits through which pass electrical pulses containing components of very high frequency, the parts of the connectors through which these pulses flow often have the disadvantage that they introduce breaks in the impedance-matching and the looped or folded form of certain portions of the contact members often gives rise to undesirable inductive coupling between the circuits.

The connector arrangement described in U.S. Pat. No. 3,609,463 has as an object to overcome these disadvantages of these known conectors. As disclosed in that patent, electrical connection is provided by means of connectors in which the conductive portions are of remarkably small length and in which the conductive surfaces providing the contact are each subject, at a number of points, to mechanical pressure which is exerted by means of mechanical members independent of the electrical circuits. In the case envisaged, where the conductors utilized with printed circuits on the removable cards and with the connection panel, may be compared to sections of transmission line of a predetermined characteristic impedance, another object of U.S. Pat. No. 3,609,463 is to provide a connector, described above, in which the length of a conductive member capable of presenting a different characteristic impedance locally is fairly small so that the resulting disadvantages will be negligable or non-existent.

In accordance with the objects of U.S. Pat. No. 3,609,463, there is described in that patent an arrangement to connect circuits on printed-circuit cards to circuits on a printed-circuit connection panel wherein the panel supports a plurality of connectors arranged parallel to and at a distance from one another so as to allow a card to be inserted between two consecutive connectors and to be held in position perpendicularly to the panel. Each connector described in the patent is characterised in that it includes, at least on a side which corresponds to that face of the printed circuit card provided with contact areas, a row of flexible, conductive contact blades. One part of each of the contact blades is soldered to a conductive area on the connection panel and another part located against a contact area on the printed circuit card. A row of push members is arranged so that each is able to slide in a seating disposed opposite a contact blade. A row of springs is arranged so that each biases a push member against a contact blade and in turn biases the contact blade against a corresponding contact area on the printed circuit card. In an advantageous embodiment described in U.S. Pat. No. 3,609,463, contact blades are formed by metal strips carried by a thin sheet of insulating material that is common to all the contact blades associated with one connector.

An arrangement consisting of such connectors allows an assembly of compact circuits to be produced in which contact is provided between circuits with the maximum safety while at the same time, causing a minimum disturbance to the electrical characteristics of the circuits.

However, the presence of push members in this patented arrangement is attended by a certain disadvantage. Firstly, the push member increases the size of each connector, thus setting a limit to the density of the integrated circuit cards which can be connected together. Furthermore, because of the space which the push members take up, they restrict the possible number of contact areas. Moreover, because of their relative rigidity, the push members expose the metal contact strips, whose supporting sheet they place under tension, to considerable wear as a result of the rubbing which accompanies the insertion and withdrawal of the printed circuit cards. Finally, the insulating push members give rise to undesirable capacitance between the springs and the metal contact strips.

The improved connector of the present invention overcomes these disadvantages. As in the invention described in U.S. Pat. No. 3,609,463, the present invention relates an arrangement for connecting circuits on printed circuit cards to circuits on a printed circuit connection panel wherein the panel supports a plurality of connectors arranged parallel to and at a distance from one another so as to allow a card to be inserted between two consecutive connectors and to be held in position perpendicularly to the panel. Each improved connector includes at least on a side corresponding to that face of a printed circuit, a card which is provided with contact areas, a row of flexible, conductive contact blades which are formed by conductive strips carried on one face of a thin, common insulating sheet and a row of springs. One part of each of the contact blades is soldered to a conductive area on the connection panel and another part of the contact blades is located against a contact area on the printed circuit card. Each of the springs is intended to press one of the contact blades against a corresponding contact area on the printed circuit card and is characterised in that it presses directly against the opposite face of the common insulating sheet that which carries the conductive strips.

Thus, in the improved connector of the present invention, the push members are dispensed with and as a result, the connectors may be made smaller in size and the density of the printed circuit cards and the contact areas increased. Furthermore, the springs may be made less stiff than the push members and this permits the springs to yield easily under the pressure of the printed circuit cards which cuts down the wear on the contact blades.

In an advantageous embodiment of the present invention, each spring has two bosses to apply pressure to the corresponding contact blade at two separate points. Moreover, the connection panel may include a grounded lug connected to the various springs, and in this way, undesirable capacitance is suppressed.

The FIGURES in the accompanying drawings will provide good understanding of how the invention may be put into effect.

DESCRIPTION OF THE PREFERRED EMBODIMENT

Figure 1:
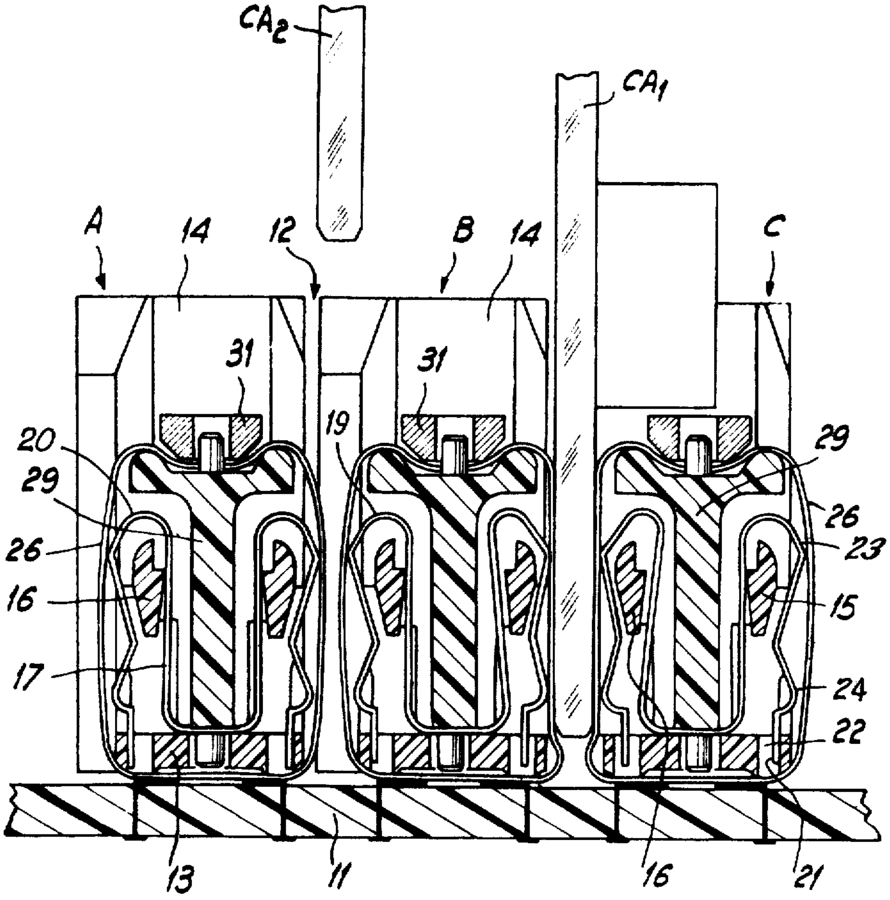
FIG. 1 is a cross-sectional view of part of an improved connector arrangement according to the invention.
Figure 2:
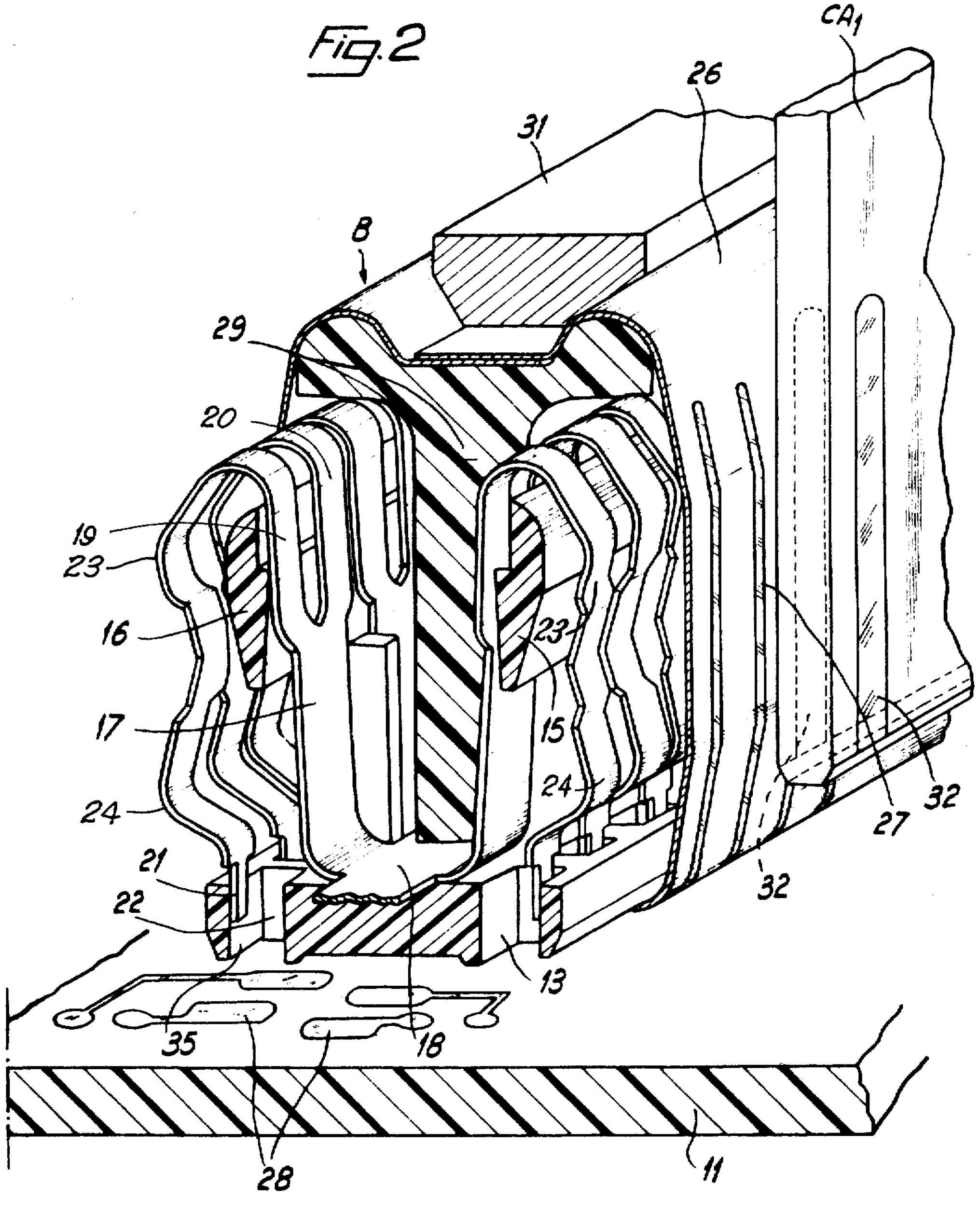
FIG. 2 is a partly broken away perspective view of an improved connector according to the invention.

FIG. 1 shows part of an arrangement in which three improved connectors, A, B and C of the present invention are mounted on a printed circuit connection panel 11. All the connectors A, B and C are parallel and, in the main, identical. A conventional printed circuit card CA1 is shown inserted between connectors B and C and a second conventional printed circuit card CA2 is shown in a pre-inserted position, connectors before it is engaged in guide means 12 which are arranged at the ends of the connectors A and B to ensure that cards are correctly engaged between the connectors.

Connectors A, B and C are located on the connection panel 11 by means, for example, of pegs which are arranged at intervals along each connector so as to allow the connector to be attached to the connection panel 11 parallel to other connectors and so as to allow a fixed distance to be maintained between the longitudinal axes of the connectors. with this distance being determined by the thickness of the printed circuit boards to be inserted between the connectors. In other words, depending on the distance between the longitudinal axes of the connectors, as attached to the panel 11, the same type of connectors may thus be used in assemblies intended to accept printed circuit cards of different thicknesses.

Figure 3:
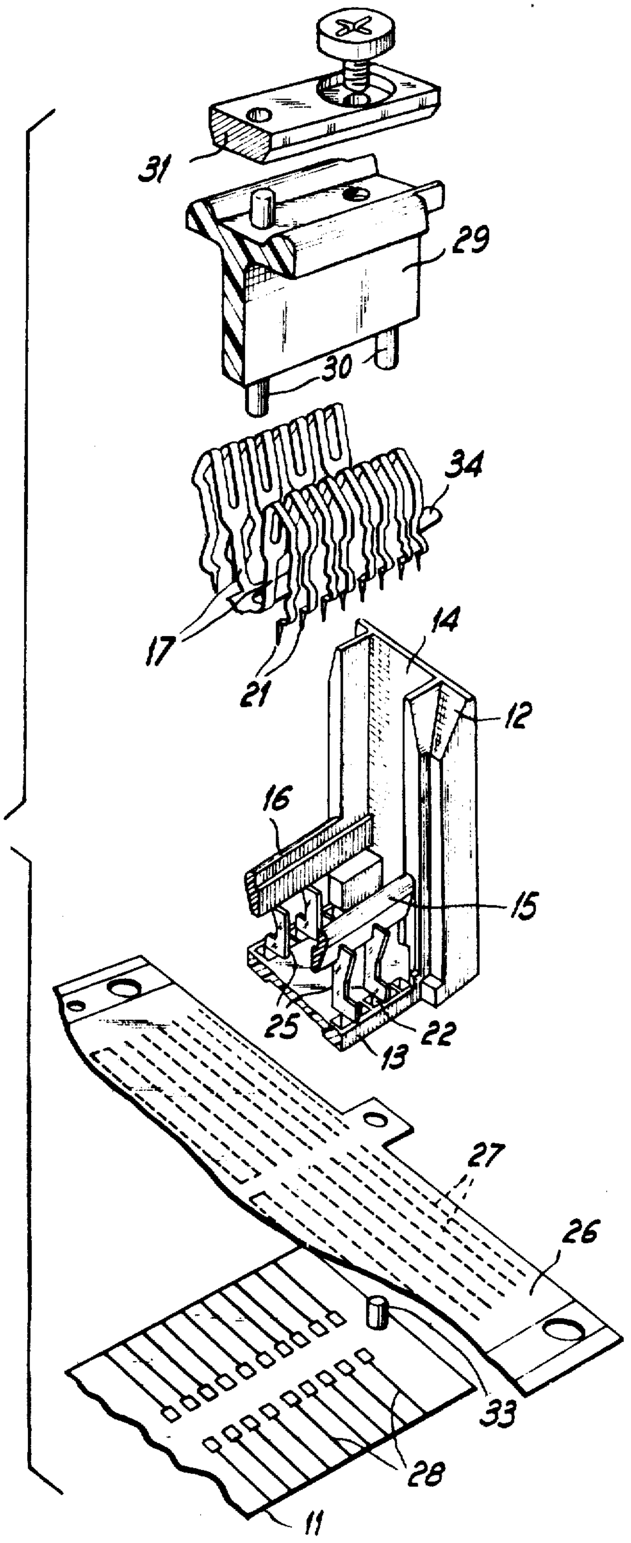
FIG. 3 is an exploded view of part of an improved connector according to the invention.
Figure 4:
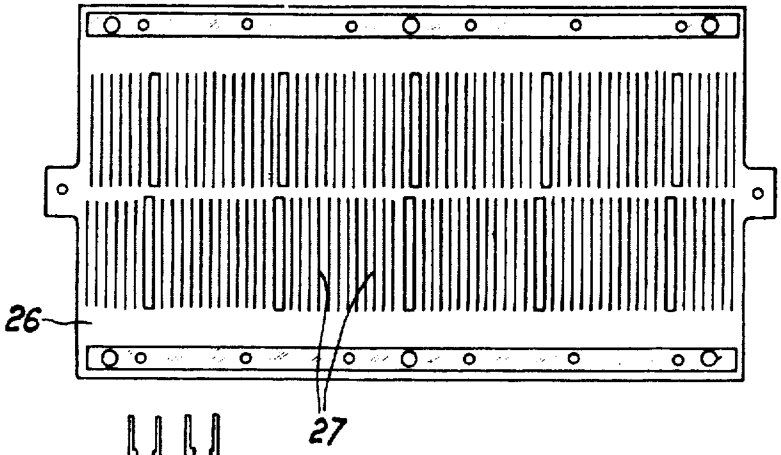
FIG. 4 is a plan view of a thin insulating sheet which is provided with contact blades in the form of metal strips.

As FIGS. 1 and 3 show, each of the improved connectors A, B and C, of this invention has an insulating body 13 which has, at its end, a projection 14 in which the guide means 12 are formed. Also, the insulating body 13 has longitudinal lateral rails 15 and 16 attached to it, and a set of spring strips 17 are fit between these rails. These springs are generally in the form of a "U" and are joined together by a longitudinal center strip 18. The ends of each spring strip 17 are formed into bifurcated prongs 19 and 20 which are folded over, in an outward direction, in such a way that their ends extend down to the same level as center strip 18. These ends have points 21 which fit, with free play, into seatings 22 provided in the body 13.

Figure 7:
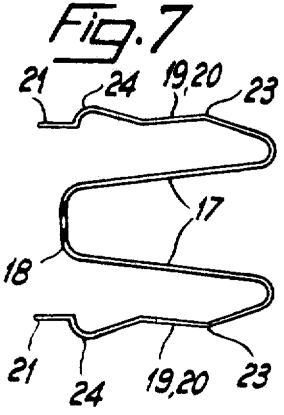
FIG 7 is a view taken along the line VII — VII in FIG. 6.

Prongs 19 and 20 form independent leaf springs which are intended to press or bias conductive contact blades 27 against the printed circuit cards. These prongs (see FIG. 7) each have two outwardly directed bosses 23 and 24 which form the points at which the prongs apply pressure to the conductive blades 27. In addition, to prevent the prongs 19 and 20 from rubbing against the posts 25 (see FIG. 3) associated with rails 15 and 16, the prongs are shaped, in plan, so as to diverge from or converge towards their neighbors.

A thin insulating sheet 26, which carried conductive contact blades 27, is connected to circuit 28 by soldering one end of the blades 27 to certain areas on the circuit 28. The body 13 is positioned on this thin sheet 26 and the leaf springs prongs 19 and 20 of the spring strip 17 are arranged between the rails 15 and 16. The prongs are held in position by a T-shaped isolating bar 29 which has locating studs or posts 30 that cooperate with corresponding holes in the body 13. The heads of the studs are flattened, ultrasonically for example, to connect body 13, center strip 18 and isolating bar 29 rigidly together.

The side edges of the thin sheet 26 are then lifted up, from the position as shown in FIG. 3, around either side of the bar 29 so that they come to rest against the top of the bar 29, where they are held in position by another bar 31. When printed circuit card is not present between adjacent connectors, as is the case with connectors A and B in FIG. 1, the thin sheet 26 is pressed against bosses 23 on prongs 19 and 20. Each prong 19 and 20 thus rest against one of the rails 15 and 16, and the points 21 fit into the seating 22 and against one wall 35 of the seating 22, with this one wall 35 being the one farthest away from center strip 18. The leaf springs prongs are thus pre-loaded and the slight displacement of bosses 23 and 24, which results from a printed circuit board being inserted, produces sufficient biasing pressure to ensure good contact between each contact blade 27 and the appropriate area 32 on the printed circuit card. In this regard, when the card is inserted between connectors, as in the case with connectors B and C in FIG. 1, both bosses 23 and 24 press against a contact blade 27 and exert, independently of one another, contact pressures which are substantially equal.

Figure 5:
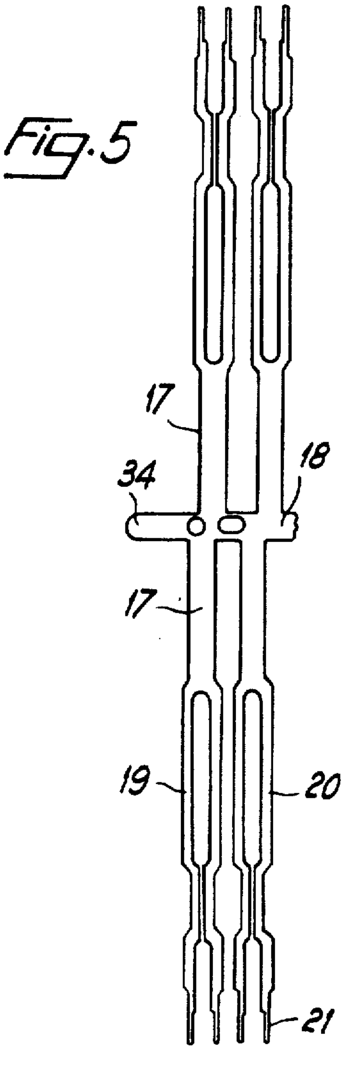
FIGS. 5 and 6 show how the springs that may be utilized with the improved connector of the present invention are formed.
Figure 6:
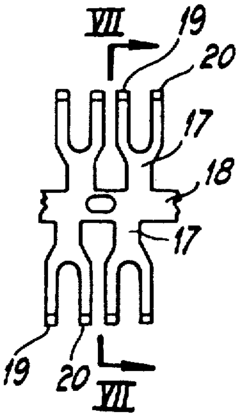

It is sometimes desirable to use the improved connector of the present invention with printed circuit cards on which the contact areas 32 on one face are staggered by half a space in relation to the contact areas 32 on the other face. In such instances, the prongs 19 and 20 which are arranged on one side of the center strip 18 are likewise staggered by half a space in relation to those situated on the other side of the strip. In particular, this arrangement can be seen in FIG. 5, which shows a flat blank for a group of springs, and in FIG. 6 which shows these springs, after bending.

As shown in FIG. 3, panel 11 has a lug 33 for locating the thin sheet 26 and the body 13 and for grounding purposes. A tab 34 on center strip 18 is applied against the lug 34, and this prevents any undesirable capacitance being set up between leaf springs prongs 19 and 20 and the contact blades 27.

I claim:

1. A connecting system for detachably connecting conductive surfaces aligned on the faces of a number N of printed circuit boards with a conductive surface on a printed circuit panel, said system comprising a number N+1 of connector elements fixed to said panel with their central longitudinal axes parallel to and spaced at a distance from one another in order to permit the insertion of an edge of one of said boards between two adjacent connector elements, each of said elements comprising:

an elongated plate of insulating material attached to said panel and provided with two rows of openings, each row extending along a respective one of the two opposite longitudinal edges of said plate, two longitudinal lateral rails of insulating material attached by their ends to said plate and disposed at the same level, each above a respective one of said rows of openings, a set of generally U shaped spring strips disposed between said rails and joined together by a longitudinal center strip fixed on said plate, each spring strip being provided at each of its ends with at least one leaf spring which is folded over so that the free end of each leaf spring is at the same level as that of said center strip, each spring strip normally being positioned, in the absence of a circuit board, with a part between each free end and the center strip in contact with a respective one of said rails, each of said leaf spring being provided at its free end with a stem adapted to be moved loosely into a respective one of said openings, said stem being normally in contact with the wall of said opening which is the nearest from the longitudinal edge next to said opening, each leaf spring being further provided with outwardly directed bosses, and two series of elongated contact blades carried by a thin sheet of insulating material, each of said blades having one end thereof bonded to a conductive surface on said panel between the latter and an opposed connector plate and having a central portion disposed opposite to an associated one of said leaf springs, whereby said central portion is urged towards a conductive surface on a printed circuit board when the latter is inserted between two adjacent connector elements.

2. A connecting system according to claim 1, wherein each connector element further comprises a generally "T" shaped insulating bar mounted on the corresponding longitudinal center strip with the longitudinal axis of the insulating bar parallel to the longitudinal axis of the connector element, said insulating bar being formed of a central partition perpendicular to the insulating plate of the connector element and of a cross arm portion parallel to said plate, the insulating sheet carrying the contact blades being gripped between the panel and said cross arm portion.

3. A connecting system according to claim 1, wherein each spring strip is bifurcated to provide two independent leaf springs and wherein each connector element further comprises two sets of posts, each set of posts being associated with a respective one of the two rows of openings, each post in each set being disposed between the part of the insulating plate joining two consecutive openings of the associated row and the longitudinal rail mounted above said row.

4. A connecting system according to claim 1, wherein each leaf spring has two bosses formed thereon and disposed respectively near the bent over portion and each free end of said leaf spring, whereby contact pressure is exerted, independently of one another, to two separate points of the corresponding contact blade.

5. A connecting system for detachably connecting conductive surface aligned on the faces of a number N of printed circuit boards with a conductive surface on a printed circuit panel, said system comprising a number N+1 of connector elements fixed to said panel with their central longitudinal axes parallel to and spaced at a distance from one another in order to permit the insertion of an edge of one of said boards between two adjacent connector elements, each of said elements comprising:

an elongated plate of insulating material attached to said panel and provided with two rows of stop means, each row extending along a respective one of the two opposite longitudinal edges of said plate, two longitudinal lateral rails of insulating material attached by their ends to said plate and disposed at the same level, each above one respective of said rows of stop means, a set of generally "U" shaped spring strips disposed between said rails and joined together by a longitudinal center strip fixed on said plate, each spring strip being provided at each of its free ends with at least one leaf spring which is folded over so that the free end of each leaf spring is at the same level as that of said center strip, each of said spring strips, in the absence of a circuit board, having a part between each of its ends and the center strip normally in contact with a respective one of said rails, each of said leaf springs being tensioned so that its free ends are urged towards the outside of the connector element, each of said free ends being normally applied against a respective one of said stop means, each of said leaf springs being provided with outwardly directed bosses, and two series of elongated contact blades carried by a thin sheet of insulating material, each of said blades having one end thereof bonded to a conductive surface on said panel betwen the latter and an opposed conductor plate and having a central portion disposed opposite to an associated one of said leaf springs, whereby said central portion is urged towards a conductive surface on a printed circuit board when the latter is inserted betwen two adjacent connector elements.

6. A connecting system according to claim 5, wherein each connector element further comprises a generally T shaped insulating bar mounted on the corresponding longitudinal center strip with the longitudinal axis of the insulating bar parallel to the longitudinal axis of the connector element, said insulating bar being formed of a central partition perpendicular to the insulating plate of the connector element and of a cross arm portion parallel to said plate, the insulating sheet carrying the contact blades being gripped between the panel and said cross arm portion.

7. A connecting system according to claim 5, wherein each spring strip is bifurcated to provide two independent leaf springs and wherein each connector element further comprises two sets of posts, each set of posts being associated with a respective one of the two rows of openings, each post in each set being disposed between the part of the insulating plate joining two consecutive openings of the associated row and the longitudinal rail mounted above said row.

8. A connecting system according to claim 5, wherein each leaf spring has two bosses formed thereon and disposed respectively near the bent over portion and each free end of said leaf spring, whereby contact pressure is exerted, independently of one another, or two separate points of the corresponding contact blades.

* * * * *